(12) United States Patent
Bernstein et al.

(10) Patent No.: US 7,807,978 B2
(45) Date of Patent: Oct. 5, 2010

(54) DIVERGENT CHARGED PARTICLE IMPLANTATION FOR IMPROVED TRANSISTOR SYMMETRY

(75) Inventors: James D. Bernstein, Plano, TX (US); Lance S. Robertson, Rockwall, TX (US); Said Ghneim, Richardson, TX (US); Jiejie Xu, Plano, TX (US); Jeffrey Loewecke, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 401 days.

(21) Appl. No.: 12/114,866

(22) Filed: May 5, 2008

(65) Prior Publication Data

US 2008/0206971 A1    Aug. 28, 2008

Related U.S. Application Data

(62) Division of application No. 11/006,185, filed on Dec. 7, 2004, now Pat. No. 7,385,202.

(51) Int. Cl.
*G01N 23/00* (2006.01)
*G21K 7/00* (2006.01)

(52) U.S. Cl. ............... 250/397; 250/398; 250/492.1; 250/492.2; 250/492.22

(58) Field of Classification Search ............... None
See application file for complete search history.

(56) References Cited

U.S. PATENT DOCUMENTS

| 6,521,897 B1 | 2/2003 | Lindquist et al. |
| 2002/0121889 A1 | 9/2002 | Larsen et al. |
| 2003/0001110 A1 | 1/2003 | Enge et al. |

*Primary Examiner*—David A Vanore
(74) *Attorney, Agent, or Firm*—Jacqueline J. Garner; Wade J. Brady, III; Frederick J. Telecky, Jr.

(57) ABSTRACT

The present invention provides a method for implanting charged particles in a substrate and a method for manufacturing an integrated circuit. The method for implanting charged particles in a substrate, among other steps, includes projecting a beam of charged particles (320) to a substrate (330), the beam of charged particles (320) having a given beam divergence; and forming a diverged beam of charged particles (360) by subjecting the beam of charged particles (320) to an energy field (350), thereby causing the beam of charged particles (320) to have a larger beam divergence. The method then desires implanting the diverged beam of charged particles (360) into the substrate (330).

10 Claims, 2 Drawing Sheets

DIVERGENT CHARGED PARTICLE IMPLANTATION FOR IMPROVED TRANSISTOR SYMMETRY

This is a divisional application of Ser. No. 11/006,185 filed Dec. 7, 2004.

TECHNICAL FIELD OF THE INVENTION

The present invention is directed, in general, to a charged particle implantation technique and, more specifically, to a charged particle implantation technique using a diverged beam of charged particles for improved transistor symmetry.

BACKGROUND OF THE INVENTION

Advanced integrated circuit design requires precise control of beam incidence angle. While a number of different types of beam incidence angle error exist, three of the more common types are cone angle error, beam steering error and parallelism error across the wafer. Cone angle error is typically a result of cone angle effects caused by the geometry of the wafer scanning system. Cone angle error causes within wafer variation. For example the beam angle error may be about −x degrees at one edge of the wafer, be approximately zero degrees as the center of the wafer, and be about +x degrees at the opposing edge of the wafer.

Steering error, on the other hand, tends to be a fixed error across the wafer that is introduced while tuning the beam between lots, implant batches, or whenever the tuning may occur. The parallelism error, for whatever reason, leads to random beam incidence angle errors across the width of the wafer. This error is particularly difficult to correct as a result of its random nature.

Unfortunately, without precise control of beam incidence angle, various different problems degrade the transistors of the integrated circuit. As an example, transistor asymmetry, variation, and depressed MPY often result due to beam incidence angle error. The beam incidence angle error also typically leads to gate shadowing and an asymmetric dopant distribution, both of which are undesirable.

Turning to FIG. 1, illustrated is an example of gate shadowing on a transistor device 100. The transistor device 100 illustrated in FIG. 1 includes a gate structure 120, having a height (h), located over a substrate 110. The transistor device 100 illustrated in FIG. 1 is being subjected to a focused implant process 130 to form implant regions 140. As is illustrated, the combination of the focused implant beam incidence angle ($\theta$) and gate structure 120 height (h) causes the implant regions 140 located within the substrate 110 not be placed equidistance from the gate structure 120. For example, one of the implant regions 140 is located a distance (d) from the sidewall of the gate structure 120, where the other implant region 140 is located adjacent the sidewall of the gate structure 120. While the distance (d) can be estimated using the equation d=h tan ($\theta$), it nevertheless creates an undoped/underdoped region defined by the distance (d) that often tends to cause serious operational problems for the transistor device 100.

Accordingly, what is needed in the art is a method for implanting dopants within a substrate that does not experience the drawbacks of the prior art methods and devices.

SUMMARY OF THE INVENTION

To address the above-discussed deficiencies of the prior art, the present invention provides a method for implanting charged particles in a substrate and a method for manufacturing an integrated circuit. The method for implanting charged particles in a substrate, among other steps, includes projecting a beam of charged particles to a substrate, the beam of charged particles having a given beam divergence, and forming a diverged beam of charged particles by subjecting the beam of charged particles to an energy field, thereby causing the beam of charged particles to have a larger beam divergence. The method then desires implanting the diverged beam of charged particles into the substrate.

The method for manufacturing an integrated circuit, on the other hand, includes implanting charged particles in a substrate proximate a transistor device region, as detailed above, and forming interconnects within dielectric layers located over the transistor device region to form an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the microelectronic industry, various features are not drawn to scale. In fact, the dimensions of the various features may be arbitrarily increased or reduced for clarity of discussion. Reference is now made to the following descriptions taken in conjunction with the accompanying drawings, in which.

Prior Art

DETAILED DESCRIPTION

The present invention is based at least in part on the unique recognition that a highly divergent beam of charged particles is more capable of dealing with an implant angle error ($\theta$) than a focused (e.g., collimated or less divergent) beam of charged particles. Specifically, the present invention has recognized that a highly divergent beam of charged particles is more capable of reaching areas previously shadowed by the gate structure than the focused beam of charged particles. Thus, for a fixed implant angle error ($\theta$), a shadowing distance (d) created during the implanting of traditional implant regions into a substrate may be reduced to a distance (d') by simply forming a diverged beam. In an ideal situation, the highly divergent implantation beam has enough of a divergence to substantially eliminate the effects of the implant angle error (θ), thus causing the reduced distance (d') to be about zero.

Figure 1:
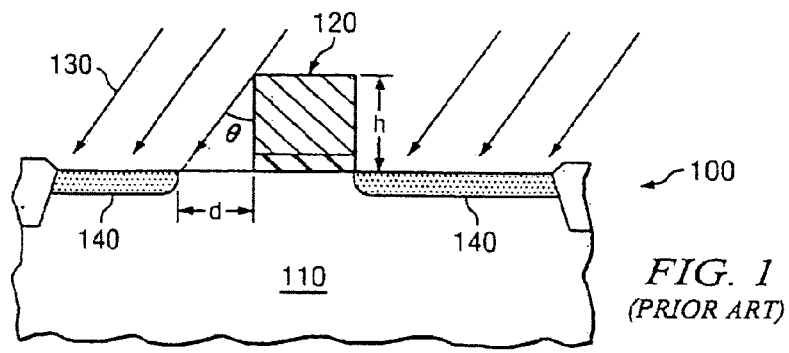
FIG. 1 illustrates an example of gate shadowing on a transistor device.
Figure 2:
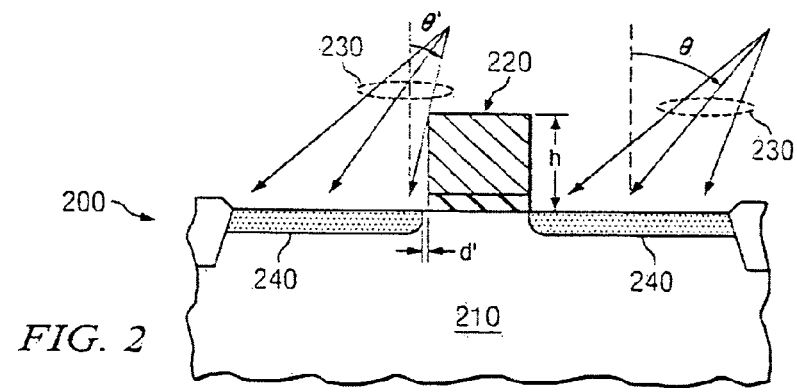
FIG. 2 illustrates a cross-sectional view of a transistor device that might receive the benefits of the unique recognition of the present invention.

Turning briefly to FIG. 2, illustrated is a cross-sectional view of a transistor device 200 that might receive the benefits of the unique recognition of the present invention. The transistor device 200 illustrated in FIG. 2 includes a gate structure 220, having a height (h), located over a substrate 210. The transistor device 200 illustrated in FIG. 2 is being subjected to a diverged beam of charged particles 230, for example a diverged ion implantation source, to form implant regions 240. The diverged beam of charged particles 230 illustrated in FIG. 2 has an implant beam incidence angle (θ). The implant beam incidence angle (θ), in the context of the present invention, is the angle between a line drawn perpendicular to the substrate 210 and a line drawn through a center of the diverged beam of charged particles 230.

As is illustrated, the divergent nature of the diverged beam of charged particles 230 substantially allows the charged particles to contact those portions of the substrate 210 directly proximate the gate structure 220. Therefore, for all intensive purposes, the distance (d') that one of the implant regions 240 would be located away from the gate structure 240 could be calculated using the equation $d'=h*\tan(\theta')\sin(\omega)$, where (h) is the height of the gate structure, (θ') is an angle between a line drawn perpendicular to the substrate 210 and the most vertical portion of the diverged beam of charged particles 230, and (ω) is the angle of rotation of a predominant axis away from a radial with respect to the implant platen. The rotation angle (ω) is typically zero (i.e., all of the angle error is in the direction of (d') when (ω)=zero), however, the above equation accommodates those situations where the rotation angle (ω) is not zero, as discussed in a related application.

Unique to the present invention, the distance (d') is significantly less than the distance (d) that would be obtained for the same beam incidence angle (θ) and gate structure height (h) for a similar transistor device in prior art structures. The reduced distance (d'), obviously, may be attributed to the divergent nature of the diverged beam of charged particles 230.

Advantageously, the reduced distance (d') provides for improved transistor symmetry between the source and drain regions of single transistors. Additionally, the reduced distance (d') provides for improved transistor symmetry between horizontal and vertical transistors in the same region on a wafer. Moreover, it provides for reduced lot-to-lot variations.

Figure 3:
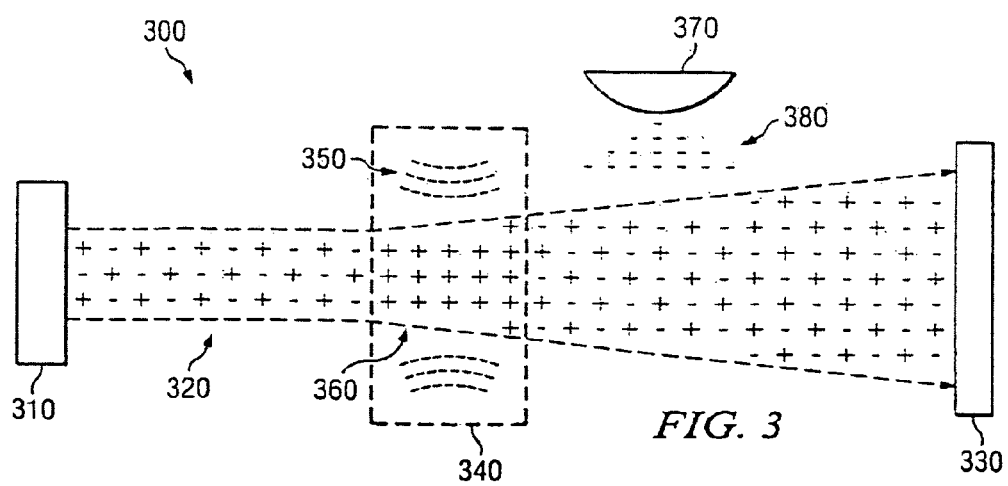
FIG. 3 illustrates a view of an implant system for implanting a beam of charged particles in a substrate.

Turning now to FIG. 3, illustrated is a view of an implant system 300 for implanting a beam of charged particles in a substrate. The implant system 300 initially includes a charged particle source 310 that is configured to project a beam of charged particles 320 to a substrate 330. The charged particle source 310 may be any known or hereafter discovered device for implanting charged particles in a substrate without departing from the scope of the present invention.

The charged particle source 310, as used in the present invention, provides the beam of charged particles 320 having a given beam divergence and given energy level. In the advantageous embodiment of the present invention, the beam of charged particles 320 is a low energy beam of charged particles. Low energy, as used herein, refers to a beam of charged particles having an energy of about 20 KeV or less. In an exemplary embodiment, however, the beam of charged particles has an energy of about 15 KeV or less, or even more advantageously of about 8 KeV or less. It goes without saying, however, that other low energy beams of charged particles could be used without departing from the scope of the present invention.

The beam of charged particles 320, as one would expect, is typically made up of both fast moving positive ions moving in one direction, and slower moving electrons moving in random directions. The electrons, as is appreciated by one skilled in the art, tend to hold the positive ions from repelling each other and causing the beam of charged particles 320 to expand.

The beam of charged particles 320, as previously discussed, has a given beam divergence. The given beam divergence is at least partially dictated by the electrons and positive ions in the beam of charged particles 320. In an advantageous embodiment of the present invention, the electrons and positive ions complement one another, and thus the given beam divergence of the beam of charged particles 320 is advantageously about zero. In this instance the beam of charged particles 320 is substantially collimated. Nevertheless, the electrons and positive ions of the beam of charged particles 320 need not complement one another, and thus the beam of charged particles 320 need not have a beam divergence of about zero in all embodiments.

As is illustrated in FIG. 3, the implant system 300 further includes an energy field source 340. The energy field source 340 is configured to subject the beam of charged particles 320 to an energy field 350, thereby causing the beam of charged particles 320 to become a diverged beam of charged particles 360. The diverged beam of charged particles 360 ultimately has a larger divergence than the beam of charged particles 320.

The energy field source 340 may comprise a number of different devices while staying within the scope of the present invention, and causing the beam of charged particles 320 to become the diverged beam of charged particles 360. In an advantageous embodiment, the energy field source 340 is a biased aperture configured to remove a portion or all of the electrons from the beam of charged particles 320. As previously indicated, without the electrons, the positive ions in the beam of charged particles 320 causes the beam of charged particles 320 to become the diverged beam of charged particles 360.

As the energy of the beam of charged particles 320 is low, for example from about 3 KeV to about 5 KeV in one embodiment, it takes little voltage for the energy field source 340 to remove a portion or all of the electrons from the beam of charged particles 320. It is believed that as little as about a 50 volt bias could deplete the beam of charged particles 320 of a portion or all of its electrons.

It should be noted that certain implant systems 300 on the market already include biased apertures. The traditional use of the biased aperture is to improve uniformity so that if for some reason the substrate 330 charges up or the beam of charged particles 320 charges up, they do not take electrons from further up stream in the beam which can modulate the beam size and cause very bad dose nonuniformity. Thus, the biased aperture previously had nothing to do with controlling angle. Moreover, the biased aperture of the prior art typically never be used for energies approaching 8 KeV or less.

While the present invention has been almost entirely discussed as using the biased aperture for the energy field source 340, those skilled in the art understand that other sources could be used. For example, in an alternative embodiment a DC aperture could be used as the energy field source 340. Those skilled in the art understand the mechanisms by which the DC aperture could cause the beam of charged particles 320 to become the diverged beam of charged particles 360, thus no detail is required.

It is often the case that the diverged beam of charged particles 360 continues to diverge without the electrons therein to prevent the positive ions from repelling each other. Accordingly, the implant source 300 may have an electron source 370 therein to reintroduce electrons 380 into the diverged beam of charged particles 360 and substantially set the divergence thereof. While many devices could be used to reintroduce the electrons 380 into the diverged beam of charged particles 360, two more common choices could be a plasma flood gun or electron shower. Other devices could nonetheless be used.

It is generally desired that the electron source 370 reintroduce the electrons 380 into the diverged beam of charged particles 360 upstream from the substrate 330. For this reason, once the desired amount of divergence is attained for the diverged beam of charged particles 360, the electrons 380 should promptly be reintroduced. As the diverged beam of charged particles 360 reaches the substrate 330, a situation similar to that shown and discussed above with respect to FIG. 2 occurs.

Figure 4:
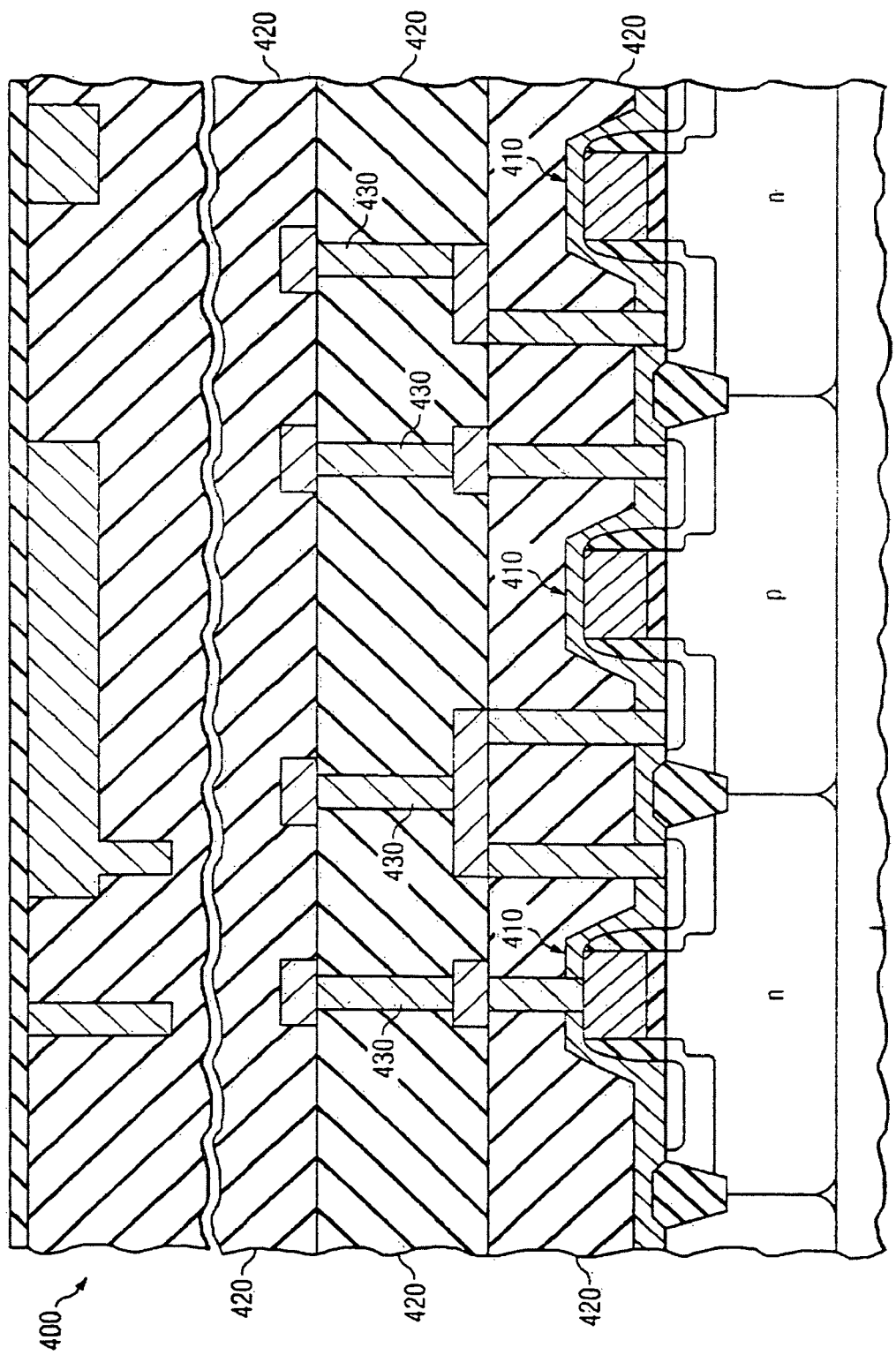
FIG. 4 illustrates a cross-sectional view of a conventional integrated circuit (IC) incorporating transistor devices constructed according to the principles of the present invention.

Referring finally to FIG. 4, illustrated is a cross-sectional view of a conventional integrated circuit (IC) 400 incorporating transistor devices 410 constructed according to the principles of the present invention. The IC 400 may include devices, such as transistors used to form CMOS devices, BiCMOS devices, Bipolar devices, or other types of devices. The IC 400 may further include passive devices, such as inductors or resistors, or it may also include optical devices or optoelectronic devices. Those skilled in the art are familiar with these various types of devices and their manufacture. In the particular embodiment illustrated in FIG. 4, the IC 400 includes transistor devices 410 having dielectric layers 420 located thereover. Additionally, interconnect structures 430 are located within the dielectric layers 420 to interconnect various devices, thus, forming the operational integrated circuit 400.

Although the present invention has been described in detail, those skilled in the art should understand that they can make various changes, substitutions and alterations herein without departing from the spirit and scope of the invention in its broadest form.

What is claimed is:

1. A method for manufacturing an integrated circuit, comprising:
    implanting charged particles in a substrate proximate a transistor device region, including:
        projecting a beam of charged particles to a substrate, the beam of charged particles having a given beam divergence;
        forming a diverged beam of charged particles by subjecting the beam of charged particles to an energy field, thereby causing the beam of charged particles to have a larger beam divergence; and
        implanting the diverged beam of charged particles into the substrate; and
    forming interconnects within dielectric layers located over the transistor device region to form an operational integrated circuit.

2. The method as recited in claim 1 wherein the given beam divergence is about zero making the beam of charged particles substantially collimated.

3. The method as recited in claim 1 wherein the beam of charged particles is a low energy beam of charged particles having an energy of about 20 KeV or less.

4. The method as recited in claim 1 wherein the beam of charged particles is a low energy beam of charged particles having an energy of about 15 KeV or less.

5. The method as recited in claim 1 wherein the beam of charged particles is a low energy beam of charged particles having an energy of about 8 KeV or less.

6. The method as recited in claim 1 wherein forming a diverged beam includes removing electrons from the beam of charged particles thereby causing the beam of charged particles to be the diverged beam.

7. The method as recited in claim 6 wherein removing electrons from the beam of charged particles includes removing electrons from the beam of charged particles using a negative bias aperture.

8. The method as recited in claim 6 wherein removing electrons from the beam of charged particles includes removing electrons from the beam of charged particles using a DC aperture.

9. The method as recited in claim 6 further including reintroducing electrons into the diverged beam to fix an angular divergence of the diverged beam.

10. The method as recited in claim 9 wherein reintroducing electrons includes reintroducing electrons using a plasma flood gun or electron shower.

* * * * *